(12) United States Patent
Kariyazaki

(10) Patent No.: US 8,680,691 B2
(45) Date of Patent: Mar. 25, 2014

(54) SEMICONDUCTOR DEVICE HAVING SEMICONDUCTOR MEMBER AND MOUNTING MEMBER

(75) Inventor: Syuuichi Kariyazaki, Tokyo (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/305,404

(22) Filed: Nov. 28, 2011

(65) Prior Publication Data

US 2012/0068362 A1    Mar. 22, 2012

Related U.S. Application Data

(63) Continuation of application No. 09/876,396, filed on Jun. 7, 2001, now abandoned.

(30) Foreign Application Priority Data

Jun. 8, 2000    (JP) ................................. 2000-171594

(51) Int. Cl.
  *H01L 23/48*    (2006.01)
  *H01L 23/52*    (2006.01)
(52) U.S. Cl.
  USPC .......... 257/786; 257/773; 257/698; 257/780; 257/E23.168
(58) Field of Classification Search
  USPC ................. 257/686, 698, 738, 678, 684, 691, 257/E23.168, 786, 773, 780
  See application file for complete search history.

(56) References Cited

U.S. PATENT DOCUMENTS

| | | | | |
|---|---|---|---|---|
| 5,324,985 A | * | 6/1994 | Hamada et al. | 257/697 |
| 5,686,764 A | * | 11/1997 | Fulcher | 257/778 |
| 5,777,383 A | | 7/1998 | Stager et al. | |
| 6,034,427 A | * | 3/2000 | Lan et al. | 257/698 |
| 6,107,685 A | * | 8/2000 | Nishiyama | 257/737 |
| 6,111,756 A | * | 8/2000 | Moresco | 361/735 |

(Continued)

FOREIGN PATENT DOCUMENTS

| | | |
|---|---|---|
| JP | 2-244755 | 9/1990 |
| JP | 9-69568 | 3/1997 |

OTHER PUBLICATIONS

U.S. Official Action mailed Apr. 1, 2002 in related U.S. Appl. No. 09/876,396.

(Continued)

*Primary Examiner* — Nitin Parekh
(74) *Attorney, Agent, or Firm* — Scully, Scott, Murphy & Presser PC

(57) ABSTRACT

A semiconductor device including: a semiconductor member having thereon a plurality of interconnect pads: and a mounting member having a plurality of electrode terminals electrically and mechanically connected to the respective interconnect pads for mounting the semiconductor chip on the mounting member, the electrode terminals forming a plurality of I/O cells each having part of the electrode terminals, the part of electrode terminals including signal terminals, the I/O cells forming a first group of the I/O cells and a second group of I/O cells disposed on an inner position of the mounting member with respect to the first group. The higher integration of the semiconductor device having the higher performances can be realized because the interconnect lines can be drawn to the outer periphery of the chip from the interconnect pads corresponding to each of the I/O cells when the chip is miniaturized or the number of the ball electrodes is increased.

5 Claims, 13 Drawing Sheets

(56) References Cited

U.S. PATENT DOCUMENTS

| | | | |
|---|---|---|---|
| 6,225,694 | B1 | 5/2001 | Terui |
| 6,271,478 | B1 | 8/2001 | Horiuchi et al. |
| 6,285,560 | B1 * | 9/2001 | Lyne .......................... 361/760 |
| 6,310,398 | B1 | 10/2001 | Katz |
| 6,459,039 | B1 | 10/2002 | Bezama et al. |
| 2001/0050423 | A1 | 12/2001 | Kariyazaki |
| 2002/0014691 | A1 | 2/2002 | Yoon et al. |

OTHER PUBLICATIONS

U.S. Official Action mailed Oct. 18, 2005 in related U.S. Appl. No. 09/876,396.
U.S. Official Action mailed Apr. 6, 2006 in related U.S. Appl. No. 09/876,396.
U.S. Official Action mailed Aug. 31, 2006 in related U.S. Appl. No. 09/876,396.
U.S. Official Action mailed Mar. 27, 2007 in related U.S. Appl. No. 09/876,396.
U.S. Official Action mailed Jan. 3, 2008 in related U.S. Appl. No. 09/876,396.
U.S. Official Action mailed Sep. 9, 2008 in related U.S. Appl. No. 09/876,396.
U.S. Official Action mailed Apr. 28, 2009 in related U.S. Appl. No. 09/876,396.
U.S. Official Action mailed Oct. 29, 2009 in related U.S. Appl. No. 09/876,396.
U.S. Official Action mailed Jul. 1, 2010 in related U.S. Appl. No. 09/876,396.
U.S. Official Action mailed Jan. 20, 2011 in related U.S. Appl. No. 09/876,396.
U.S. Official Action mailed Jul. 27, 2011 in related U.S. Appl. No. 09/876,396.
U.S. Official Action mailed Jun. 24, 2010 in related U.S. Appl. No. 12/730,336.
U.S. Official Action mailed Jan. 21, 2011 in related U.S. Appl. No. 12/730,336.
U.S. Official Action mailed Jul. 27, 2011 in related U.S. Appl. No. 12/730,336.
U.S. Official Action mailed Dec. 5, 2011 in related U.S. Appl. No. 12/730,336.
U.S. Official Action mailed May 8, 2013 in related U.S. Appl. No. 12/730,336.
U.S. Official Action mailed Sep. 10, 2012 in related U.S. Appl. No. 13/305,404.

* cited by examiner

PL  CELL-2

PL  CELL-2     CELL-2A
         CELL-2B

PL  CELL-1

PL  CELL-1    CELL-1A
        CELL-1B

CELL-1  PL  CELL-2

PL  CELL-2   CELL-2A
       CELL-2B

CELL-1

CELL-1  PL  CELL-2

PL  CELL-1   CELL-1A
       CELL-1B

CELL-2

SEMICONDUCTOR DEVICE HAVING SEMICONDUCTOR MEMBER AND MOUNTING MEMBER

CROSS REFERENCE TO RELATED APPLICATIONS

The present application is a continuation application of U.S. patent application Ser. No. 09/876,396 filed on Jun. 7, 2001, which claims priority of Japanese Patent Application No. 2000-171594 filed on Jun. 8, 2000, the entire contents of each of which are incorporated herein by reference.

BACKGROUND OF THE INVENTION (a) Field of the Invention

The present invention relates to an area-array semiconductor device having arranged external electrode terminals on the bottom surface of a chip or the bottom surface of a package, and more in detail to the semiconductor device having a reduced size of the chip or the package and to increase the number of the external electrode terminals.

(b) Description of the Related Art

With the higher integration of a semiconductor device, the number of external electrode terminals for externally and electrically connecting a chip or a package mounting the chip is increased. On the other hand, the miniaturization of the chip or the package is advanced to reduce the size of the pitch between the terminals of internal electrode terminals. Accordingly, the pitch of the interconnect pads formed on a packaging substrate or a mounting board for packaging the chip thereon is also reduced, and the reduced pitch makes it difficult to arrange the interconnects on the packaging substrate or mounting board. As a result, the miniaturization of the chip and the package is hardly realized.

A semiconductor device 101 as shown in FIG. 1 is an example of forming internal electrode terminals on the bottom surface of a chip 103 which is mounted on a packaging substrate 102. A plenty of ball electrodes 131 acting as external electrode terminals are arranged on the bottom surface of the chip 103 in a BGA (ball grid array) arrangement. The packaging substrate 102 includes, on the top surface thereof, interconnect pads 121 corresponding to the ball electrodes 131 of the chip 103 and interconnect lines 122 for connecting the respective interconnect pads 121. On the bottom surface of the packaging substrate 102 are arranged packaging ball electrodes 124 connected to the interconnect pads 121 and the interconnect lines 122 through intermediary of via-plugs 123. The chip 103 is mounted over the packaging substrate 102 and covered and sealed with resin 105, and the ball electrodes 131 of the chip 103 are connected to the interconnect pads 121 by soldering. The semiconductor device 101 is mounted on a substrate 104, and the packaging ball electrodes 124 are connected to interconnects pads 141 formed on the top surface of the substrate 104.

The interconnect pads 121 arranged on the packaging substrate 102 surface as shown in FIG. 2 are substantially identical with the ball electrodes 131 formed on the bottom surface of the chip 103 with respect to their arrangements. The conventional interconnect pad arrangement has so-called peripherals including a signal line terminal (S-terminal), a power source terminal (V-terminal) and a ground terminal (G-terminal) arranged on a single line and disposed in a region corresponding to the outer peripheral of the chip 103. As shown in FIG. 2, the respective interconnect pads 121 including the S-terminal, the V-terminal and the G-terminal are arranged in the shape of a lattice by keeping specified intervals. Each of interconnect lines 122 is connected to each of the interconnect pads 121, and extends toward the outer region of the chip. The interconnect lines 122 connected to the interconnect pads 121 existing in the inner part outwardly extend between the interconnect pads 121 existing in the outer part, and the front end of the interconnect line 122 is electrically connected to the packaging ball electrodes 124 on the bottom surface of the packaging substrate 102 through intermediary of the via-plugs 123 as shown in FIG. 1.

However, in the arrangement of the above interconnect pads, due to the density of the interconnect pads 121 and the interconnect lines 122 as shown in FIG. 3, the number of the interconnect lines 122 extending from the inner interconnect pads 121 is restricted because the diameter of the interconnect pad 121 is generally larger than the width of the interconnect lines 122 and the interval of the adjacent lines.

When the interconnect pads 121 having a diameter of 100 μm are arranged at a pitch of 250 μm, only two interconnect lines 122 can be drawn when the line width of the interconnect lines 122 is 30 μm and the line interval is 30 μm. In other words, only 12 interconnect lines 122 can be arranged in an area having a width of 1 mm in the above structure of the interconnect pads 121, and the density of the interconnect lines is 12 lines/mm. When the number of the interconnect pads is increased to increase the number of the interconnect lines, the pitch of the interconnect pads is required to be larger than 250 μm as described above or the chip size is required to be larger, thereby hardly realizing the miniaturization of the chip and the packaging substrate because the larger area is necessary to arrange the interconnect pads.

In order to solve such a problem, JP-A-10(1998)-116859 describes a technique in which interconnects pads for a standard power and a standard current which do not receive nor supply signals are disposed inside a package (chip) and the interconnects pads are connected to external connecting terminals just below the chip. In the configuration, since the interconnect pad which does not receive nor supply signals is not required to be connected to the interconnect line, the interconnect line to be arranged among the interconnect pads is unnecessary, thereby reducing the interval between the adjacent interconnect pads. As a result, the number of the interconnect pads can be increased and the miniaturization of the chip can be attained.

JP-A-9(1997)-69568 describes a technique in which an input-output buffer is disposed in an open region occurring in an inner circuit block-disposing area by not distinguishing an input-output buffer disposing area from the inner circuit block-disposing area in order to realize the configuration which effectively utilizes the open area occurring in the inner circuit blocks without deteriorating the fundamental algorism of a tool for automatically disposing interconnects when the input-output buffer and the inner circuit block are disposed on the chip. When the technique is applied on the chip or the package, at least the freedom of the disposition with respect to the disposition of the interconnect pads is elevated to effectively implement the miniaturization.

However, in the former publication, the number of the interconnect pads which do not receive nor supply signals is assumed not to be small. Accordingly, the technique cannot be applied when the number of the interconnect pads of this kind is small and most part of interconnect pads are required to be connected to interconnect lines. If the technique is applied to part of the interconnect pads, the number of the interconnect lines externally drawn is restricted.

In the latter publication, the number of the input-output buffers depends on the open area occurring among the inner circuit blocks, and when the open areas are concentrated, it is uncertain that the interconnect lines are drawn from the input-output buffers. Accordingly, the interconnect pads must be designed for every floor plan to increase a period of time. When the drawing-out of the interconnect lines is hardly attained, the effective means for responding thereto does not exist.

In the above technique, the interconnect line formed on the packaging substrate is assumed to be a single layer. When the interconnect line formed on the packaging substrate is made to be a multi-layered structure having two or more layers, the structure increases the freedom of arranging the interconnect lines to assist to solve the above problem. However, the multi-layered structure may make the interconnect lines of the upper layer and the lower layer crossed with each other to hardly perform the impedance matching among the interconnect lines, thereby affecting larger adverse effects on the semiconductor device.

SUMMARY OF THE INVENTION

In view of the foregoing, an object of the present invention is to provide a semiconductor device in which a chip or a package is miniaturized and the number of terminals of external connection terminals is increased.

Thus, the present invention provides a semiconductor device including: a semiconductor member having thereon a plurality of interconnect pads: and a mounting member having a plurality of electrode terminals electrically and mechanically connected to the respective interconnect pads for mounting the semiconductor chip on the mounting member, the electrode terminals forming a plurality of I/O cells each having part of the electrode terminals, the part of electrode terminals including signal terminals, the I/O cells forming a first group of the I/O cells and a second group of I/O cells disposed on an inner position of the mounting member with respect to the first group.

In accordance with the present invention, the higher integration of the semiconductor device having the higher performances can be realized because the interconnect lines can be drawn to the outer periphery of the chip from the interconnect pads corresponding to each of the I/O cells when the chip is miniaturized or the number of the ball electrodes is increased.

Since the interconnect pads and the interconnect lines corresponding to the I/O cell is made by the single conductive film, the interconnect lines connected to the single I/O cell are not crossed in the vertical direction to easily perform the impedance matching on each of the interconnect lines.

The above and other objects, features and advantages of the present invention will be more apparent from the following description.

PREFERRED EMBODIMENTS OF THE INVENTION

Figure 4:
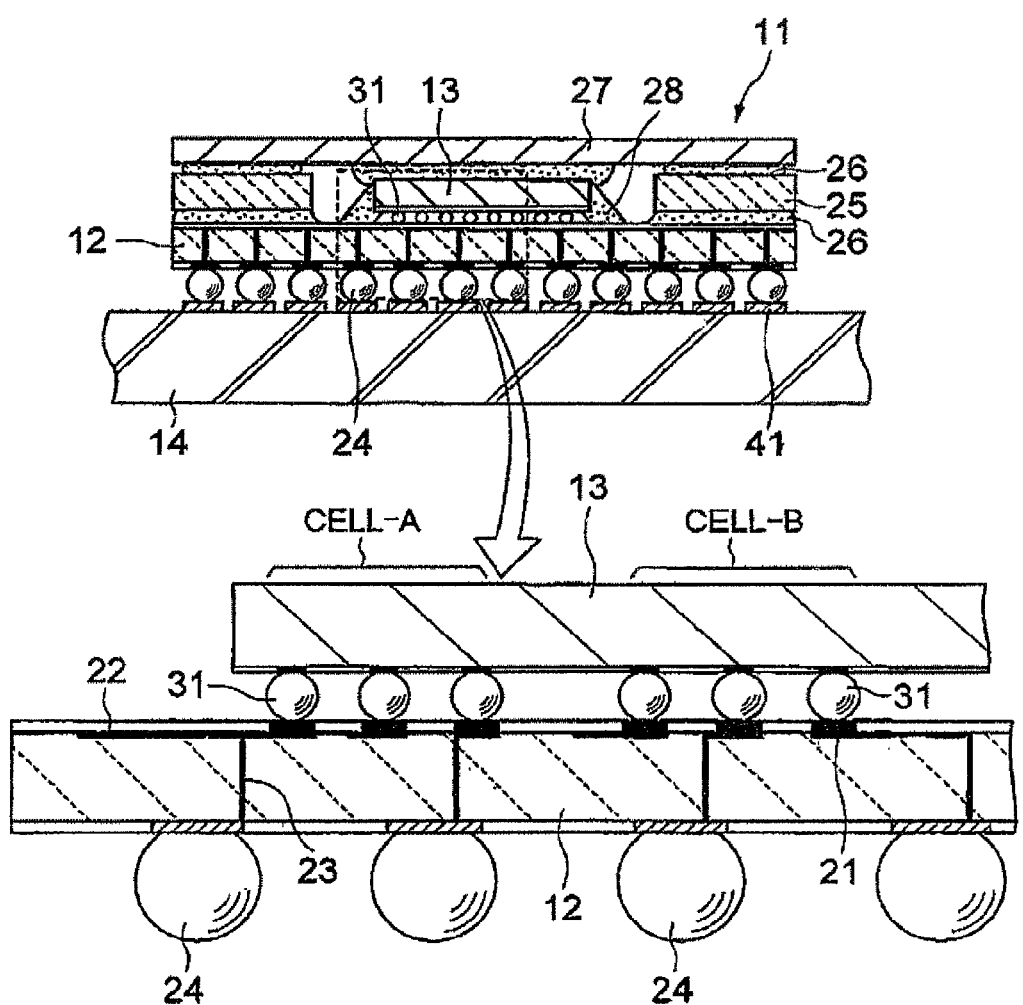
FIG. 4 is a vertical sectional view showing a semiconductor device in accordance with a first embodiment of the present invention and an enlarged view thereof.

Then, the configuration of a semiconductor device of a first embodiment will be described referring to FIG. 4.

A semiconductor device 11 includes a packaging substrate 12 and a chip 13 mounted thereon. The packaging substrate 12 is formed by a dielectric plate material and includes, on the top surface thereof, a plenty of interconnect pads 21 and interconnect lines 22 formed by etching a conductive film made of copper. The interconnect pads 21 and the interconnect lines 22 are connected to for mounting ball electrodes 24 on the bottom surface of the packaging substrate 12 through intermediary of via-plugs 23 formed through the packaging substrate 12. A flame-like spacer 25 is fixed to the periphery of the top surface of the packaging substrate 12 by using an adhesive agent, and accommodates the chip in the region surrounded the spacer 25. A covering plate 27 is fixed on the spacer 25 by using another adhesive agent 26 to seal the chip 13.

The chip 13 is formed by a semiconductor substrate such as silicon, and various elements such as a transistor not shown in the drawing are formed on the bottom main surface of the chip 13 and are covered with a protective dielectric film such as a passivation film. On the surface of the protective dielectric film or on the bottom surface of the chip are formed and arranged ball electrodes 31 made of solder, connected to the above elements, acting as internal electrodes. The ball electrodes 31 are soldered to the interconnect pads 21 formed on the packaging substrate 12 to mount the chip 13 on the packaging substrate 12 in a face-down manner, and the elements in the chip 13 are electrically connected to the ball electrodes 24 on the bottom surface of the packaging substrate 12 through intermediary of the ball electrodes 31 and the interconnect pads 21. The chip 13 is sealed is sealing resin 28.

In the first embodiment, the semiconductor device 11 is mounted on a dielectric substrate, mounting substrate 14. A specified interconnect pattern is formed on the dielectric substrate by using a conductive film to prepare the mounting substrate 14. The interconnect pattern includes interconnect pads 41 connected to the ball electrodes 24 of the semiconductor device 11 and interconnect lines, not shown in the drawings, for connecting the interconnect pads 41 among one another on the mounting substrate 14 or the interconnect pad 41 with interconnect lines not shown in the drawings for connecting the interconnect pad 41 to an external circuit.

An example of configuration will be described, referring to FIG. 4, in which the ball electrodes 31 are formed and arranged on the bottom surface of the chip 13 of the semiconductor device 11 and interconnect pads 21 are formed and arranged on the top surface of the packaging substrate 12 corresponding to the ball electrodes 31.

Figure 5:
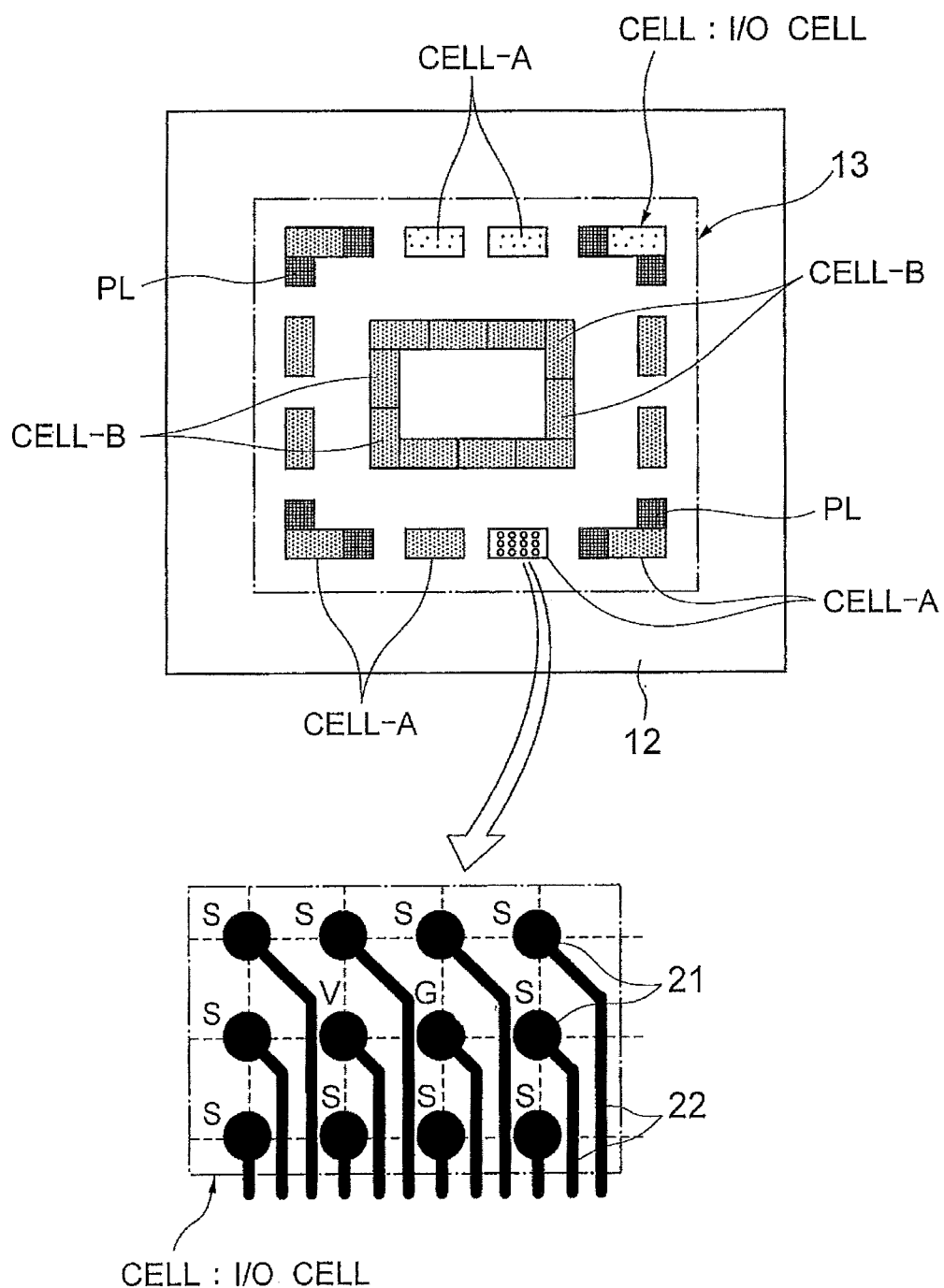
FIG. 5 is a schematic view showing interconnect pads and interconnect lines arranged on a packaging substrate of the first embodiment.

The interconnect pads 21 formed on the top surface of the packaging substrate 12 shown in FIG. 5 are disposed corresponding to the ball electrodes 31 on the bottom surface of the chip 13. The ball electrodes 31 on the bottom surface of the chip 13 are arranged in the shape of a lattice and the interconnect pads 21 are also arranged in the shape of the lattice corresponding to the ball electrodes 31. The specified number of the ball electrodes 31 and the interconnect pads 21 are grouped as a single I/O cell as shown in FIG. 5 in which only the interconnect pads 21 are shown, and these are arranged as the I/O cell unit. In the embodiment, the plenty of the interconnect pads 21 are divided such that the single I/O cell includes an array of 4×3 interconnect pads 21, arranged in a first row, a second row, a third row, a first column, a second column, a third column, and a forth column. The I/O cell is, for example, a single group including a single unit having one or more input-output buffers formed in the chip 13 and an S-terminal (signal line terminal), a V-terminal (power source terminal) and a G-terminal (ground terminal) connected to the input-output buffers, or the single I/O cell may include only the S-terminal. However, the number of the terminals and the arrangement are not restricted to the above, and an I/O cell having an arbitrary array can be formed.

Among the grouped I/O cells, part of the I/O cells (CELL-A) are disposed on the periphery of the chip 13 similarly to the conventional chip, and the remaining cells (CELL-B) are internally disposed from the above I/O cells (CELL-A) at a specified interval. In this case, the adjacent I/O cells (CELL-A) disposed on the periphery have a specified space therebetween. In the first embodiment, if the additional space exists between the adjacent I/O cells (CELL-A), peripherals (PL) conventionally used are also disposed on the chip. The peripherals are present in the open space in the 4×3 array.

Figure 6:
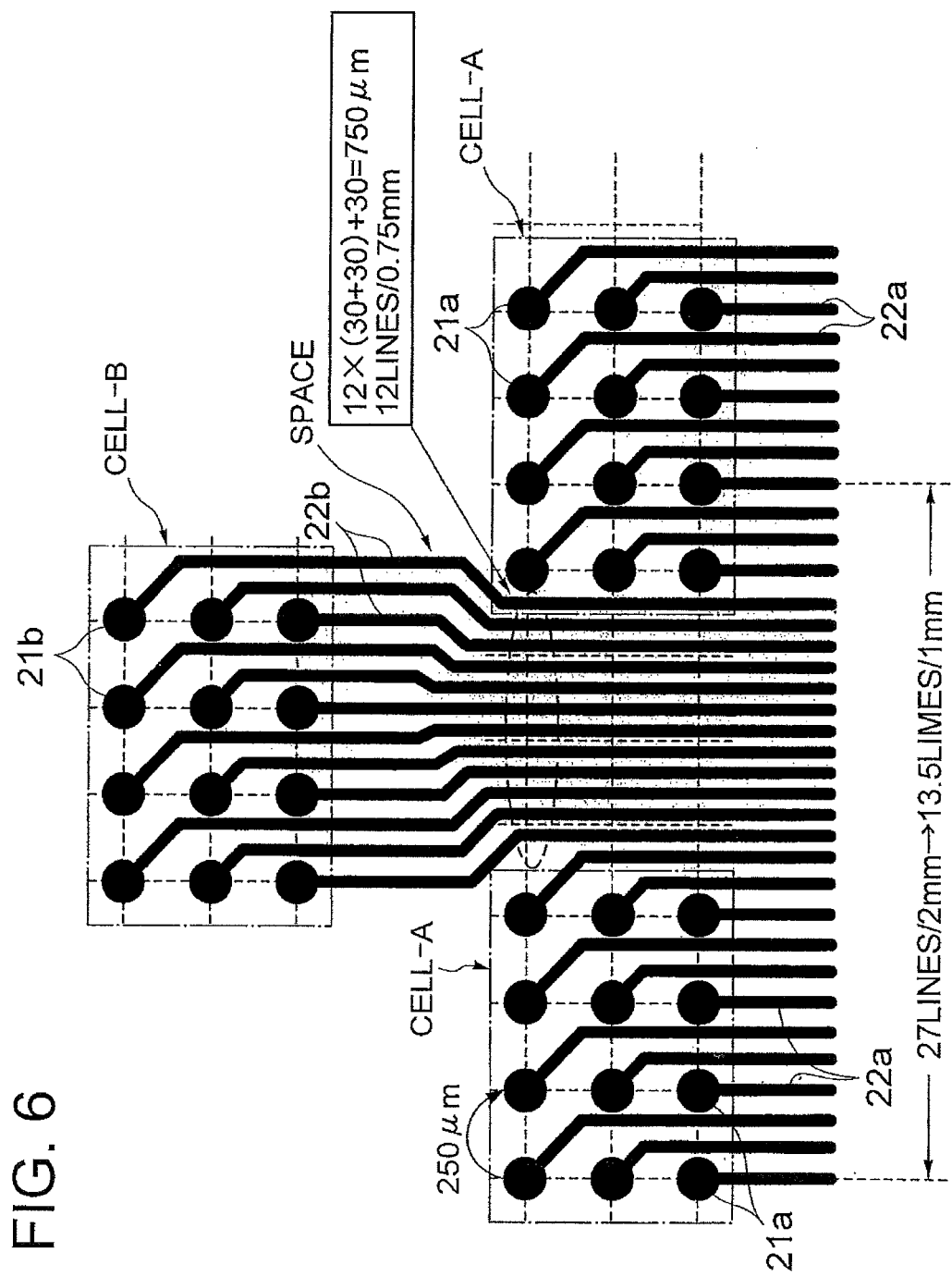
FIG. 6 is a schematic view showing the density of the interconnect pads and the interconnect lines of FIG. 5.

As shown in FIG. 6, two outer peripheral I/O cells (CELL-A) on the chip 13 are disposed with a specified interval along the periphery, and one inner I/O cell (CELL-B) is disposed in a space opposing to the location between the two outer peripheral I/O cells (CELL-A). Similarly to the preceding example, the interconnect lines 22a are connected to each of the interconnect pads 21a of the two outer peripheral I/O cells (CELL-A), and are drawn between the interconnect pads 21a to regions external to the chip 13. On the other hand, the interconnect lines 22b are connected to each of the interconnect pads 21b of the inner peripheral I/O cell (CELL-B), and are drawn similarly to the preceding example in the region of the peripheral I/O cell (CELL-B), and are bundled at a specified interval, at a region out of the inner peripheral I/O cell (CELL-B), to be drawn between the outer peripheral I/O cells (CELL-A) to regions external to the chip 13.

Figure 3:
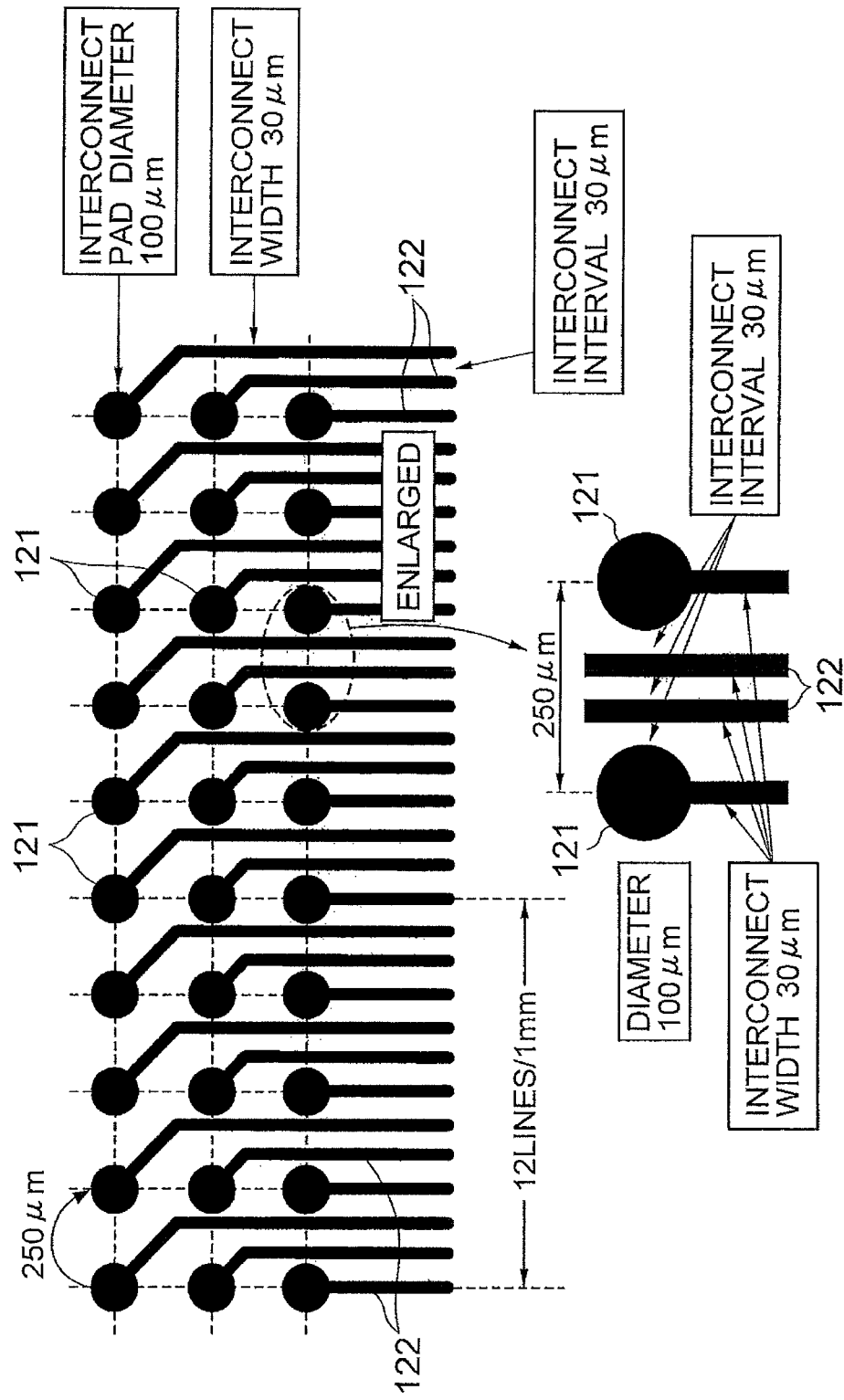
FIG. 3 is a schematic view showing the density of the conventional interconnect pads and interconnect lines.

In the structure of the interconnect pads 21 and the interconnect lines 22 on the packaging substrate 12, the density of arranging the interconnect lines 21a at the I/O cells (CELL-A) arranged on the outer periphery of the chip 13 is substantially same as the density of the conventional device shown in FIG. 3. However, the density of arranging the interconnect lines 22b connected to the interconnect pad 21b of the I/O cells (CELL-B) arranged inside of the chip 13 can be increased because of the absence of the interconnect pads.

When the line width of the interconnect lines connected to the 12 interconnect pads 21 is 30 µm and the line interval is 30 µm as shown in FIG. 6, the dimension of arranging the 12 bundled interconnect lines 22i is 750 µm. The number of the interconnect lines 22 in the region having a size of 2 mm along the outer periphery of the chip is 27 calculated by adding the number of the interconnect lines 22a of the outer peripheral I/O cells (CELL-A) to the number of the interconnect lines 22b of the inner I/O cells (CELL-B). The density of the interconnect lines 22 is 13.5 lines/mm in the embodiment, and is increased compared with conventional density of 12 lines/mm shown in FIG. 3.

Thereby, even when the size of the chip 13 is reduced for miniaturization or the numbers of the ball electrodes 31 and the interconnect pads 21 are increased with the chip 13 having the same size, the higher integration of the semiconductor device having the higher performances can be realized by dividing the ball electrodes 31 disposed on the chip 13 and the interconnect pads arranged on the packaging substrate 12 into the plurality of the I/O cells and disposing part of the I/O cells at the outer periphery of the chip 13 and the remaining I/O cells at the corresponding inner sections of the chip 13 because the drawing-out of the interconnect lines 22 to the peripheral outer regions of the chip on the top surface of the packaging substrate 12 is possible.

Especially, as shown in FIG. 6, since the interconnect lines of the other I/O cells do not pass through the I/O cells (CELL-B) disposed on the inner section of the chip, the I/O cells (CELL-B) may be formed to enable the arrangement of the extremely larger number of the ball electrodes 31 and the interconnect pads 21. An interval may exist between the I/O cells (CELL-B) disposed on the inner section. The ball electrodes 31 and the interconnect pads 21 of the outer peripheral I/O cells (CELL-A) may be freely disposed so long as the spaces through which the interconnect lines 22 of the I/O cells (CELL-B) disposed on the inner section pass may be secured, thereby promoting the higher integration of the semiconductor device having the higher performances. The I/O cells can be freely disposed in the regions of the chip so long as the above requisites are satisfied to increase the freedom of the chip design and the package design.

Since the interconnect pads 21 and the interconnect lines 22 in the embodiment are made by the conductive film having the single layer, the interconnect lines connected to the single I/O cell are not crossed in the vertical direction to easily perform the impedance matching on each of the interconnect lines. Especially, when the interconnect pads and the interconnect lines corresponding to the plurality of the input-output buffers are intermingled in the single I/O cell, the proper impedance matching is possible by preventing the mutual intervention between the interconnect lines of each of the input-output buffers.

Figure 7:
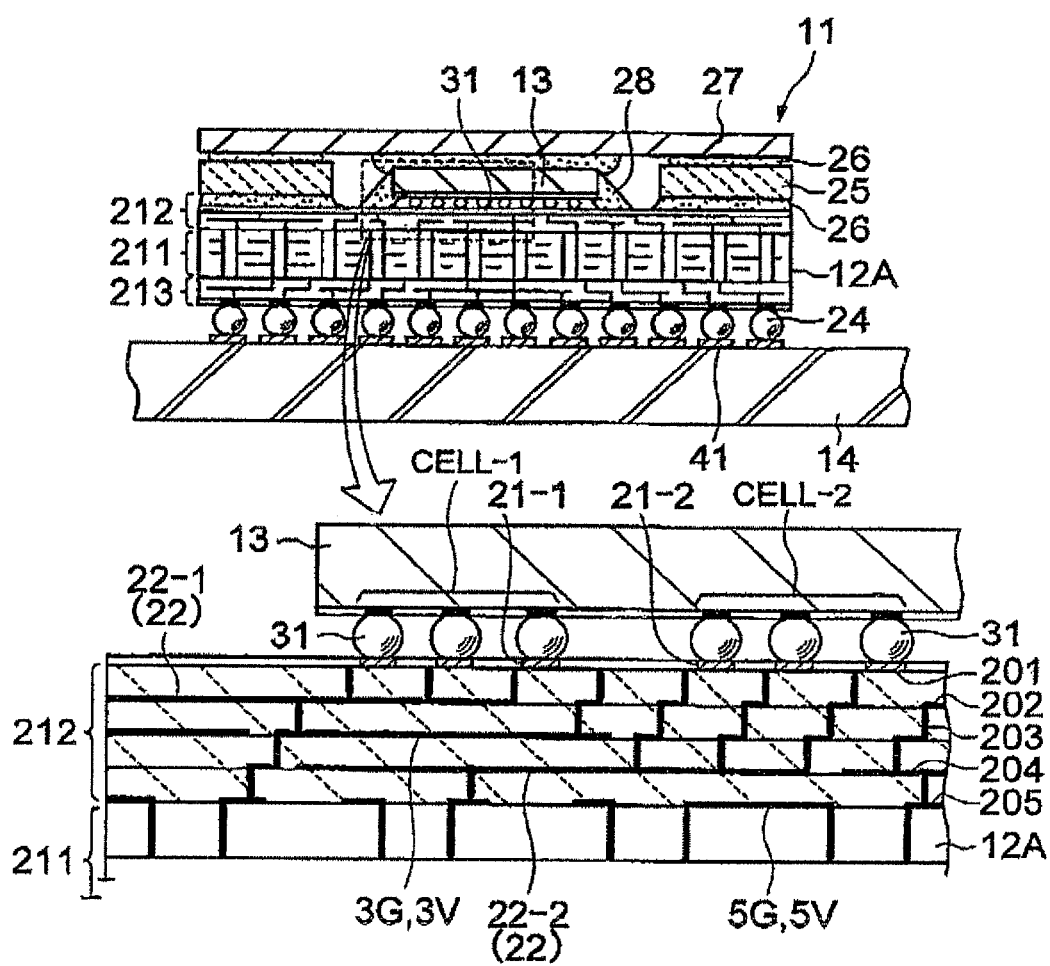
FIG. 7 is a vertical sectional view showing a semiconductor device in accordance with a second embodiment and an enlarged view thereof.

A second embodiment of the present invention is shown in FIG. 7 in which the same numerals as those of the first embodiment designate the same elements. A semiconductor device 11 includes a packaging substrate 12A and a chip 13 mounted thereon. The packaging substrate 12A includes a central core layer 211 sandwiched between a pair of buildup layers 212, 213, and a plenty of interconnect pads 21 made of a conductive film are formed on the top buildup layer 212. The interconnect pads 21 are connected to the interconnect lines in each of the multi-layers of the top buildup layer 212, further connected to the bottom buildup layer 213 through intermediary of via plugs, and still further connected to ball electrodes 24 formed on the bottom surface of the bottom buildup layer 213 or the bottom surface of the packaging substrate 12A.

Each of the buildup layers is multi-layered, and the top buildup layer 212 includes five interconnect layers in which a first layer includes the interconnect pads 21 and a ground GND layer, a third layer includes a GND layer 3G and a voltage VDD layer 3V, and a fifth layer includes a GND layer 5G and a VDD layer 5V connected to the via plugs of the above core layer. A second layer and a fourth layer are formed as independent interconnect lines 22a, 22b for signals. In the second embodiment, the interconnect lines formed in the single layer in the first embodiment are divided into the first to fifth interconnect layers 201 to 205. Especially, the interconnect lines connected to the interconnect pad 21 acting as the S-terminal (signal terminal) can be drawn as the interconnect lines 22 of the second and fourth layers separately from the others.

Figure 8:
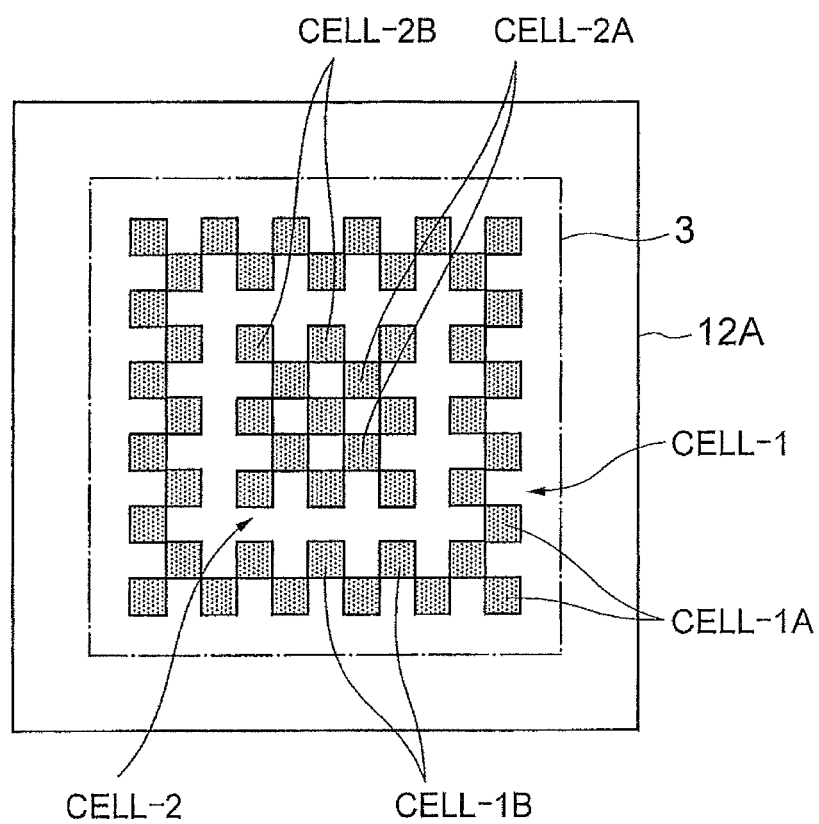
FIG. 8 is a schematic view showing interconnect pads and interconnect lines arranged on a packaging substrate of the second embodiment.

In view of the increased number of layers (two-layered) of the interconnect lines 22a, 22b, as schematically shown in FIG. 8, the grouped I/O cell in the arrangement of the interconnect pads 21 as well as the ball electrodes 31 of the chip 13 can be divided into a first I/O cell (CELL-1) and a second I/O cell (CELL-2). Part of the first I/O cell (CELL-1 or a first group of I/O cells) or I/O cells (CELL-1A) are disposed on the outer peripheral region of the chip 13, arranged in a first row and a first column, and the remaining I/O cells (CELL-1B) are disposed on the inner sections of the chip 13, arranged in a second row and a second column. Intervals are secured between the first I/O cells (CELL-1A) remaining on the outer periphery for passing the interconnect lines 22 drawn from the inner I/O cells (CELL-1B). In FIG. 8, the first I/O cells (CELL-1) disposed on the outer periphery are alternately disposed on outer sections (CELL-1A) and inner parts (CELL-1B) in the outer periphery. The second I/O cells (CELL-2 or a second group of I/O cells) are disposed on the sections inside of the other I/O cells (CELL-1), and part of the second I/O cell (CELL-2) or I/O cells (CELL-2A) are disposed inside of the remaining I/O cells (CELL-2B), the Cell-2B being arranged in a third row and a third column and the and the Cell-2A being arranged in a forth row and a forth column and intervals are secured between the outer second I/O cells (CELL-2A) for passing the interconnect lines drawn from the inner second I/O cells (CELL-2B). In FIG. 8, similarly to the first I/O cells (CELL-1), the second I/O cells (CELL-2) are alternately disposed on outer sections (CELL-2A) and inner parts (CELL-2B).

Referring again to FIG. 7, the interconnect line 22-1 connected to the interconnect pad 21-1 of the first I/O cell (CELL-1) is connected in its outer region to the second interconnect layer 202 of the top buildup layer 212 and drawn to the outer region by the second interconnect layer 202. The interconnect line 22-2 connected to the interconnect pad 21-2 of the second I/O cell (CELL-2) is connected in the area between its outer region and the first I/O cell (CELL-1) to the fourth interconnect layer 204 of the top buildup layer 212 and drawn to the outer region by the fourth interconnect layer 204. Accordingly, the interconnect line 22-2 connected to the second I/O cell (CELL-2) is never drawn to the outer region through the first I/O cells (CELL-1). The interconnect lines 202, 204 of the second and the fourth layers are connected to the via plugs 23 of the core layer 211 at specified positions and further connected to the ball electrodes 24 on the bottom surface of the packaging substrate 12A through intermediary of the bottom buildup layer 213.

The configuration of the interconnect pads 21 and the interconnect lines 22 on the top surface of the packaging substrate 12A obtained in this manner is similar to that shown in FIG. 6 for each of the first I/O cell (CELL-1) and the second I/O cell (CELL-2), and enables to elevate the density of the interconnect pads 21 and the interconnect lines 22 of the first I/O cell (CELL-1) and the second I/O cell (CELL-2). Since the first I/O cell (CELL-1) and the second I/O cell (CELL-2) are double-disposed in the second embodiment, the density almost twice that of the first embodiment can be obtained. Thereby, even when the chip is miniaturized or the numbers of the ball electrodes and the interconnect pads are increased, the higher integration of the semiconductor device having the higher performances can be realized by drawing the interconnect lines of each of the I/O cells.

Since the interconnect lines 22-1 of the first I/O cell (CELL-1) is drawn by the second interconnect layer 202 and the interconnect lines 22-2 of the second I/O cell (CELL-2) is drawn by the fourth interconnect layer 204 in the second embodiment, the interconnect lines connected to the respective I/O cells are drawn to the single interconnect layer and are not crossed in the vertical direction to easily perform the impedance matching on each of the interconnect lines. Especially, when the interconnect pads and the interconnect lines corresponding to the plurality of the input-output buffers are intermingled in the single I/O cell, the proper impedance matching is possible by preventing the mutual intervention between the interconnect lines of each of the input-output buffers similarly to the first embodiment.

Figure 9A:
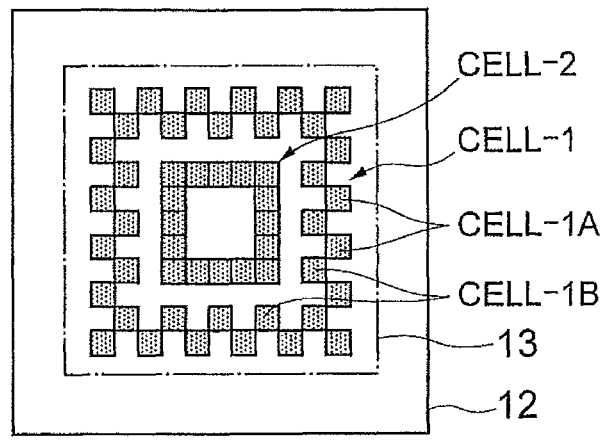
FIGS. 9A to 9C are a schematic views showing first modified examples of ball electrodes and the interconnect pads of the second embodiment.
Figure 9B:
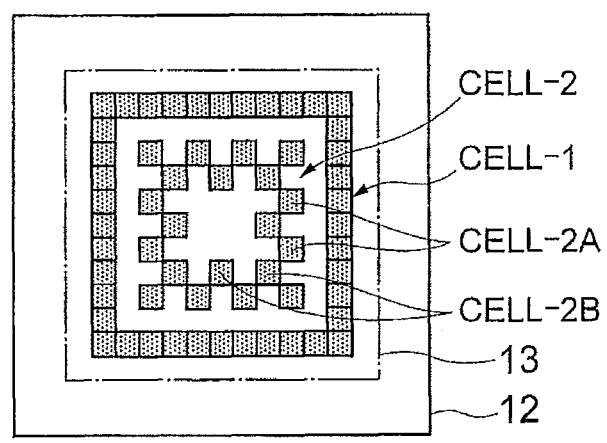
Figure 9C:
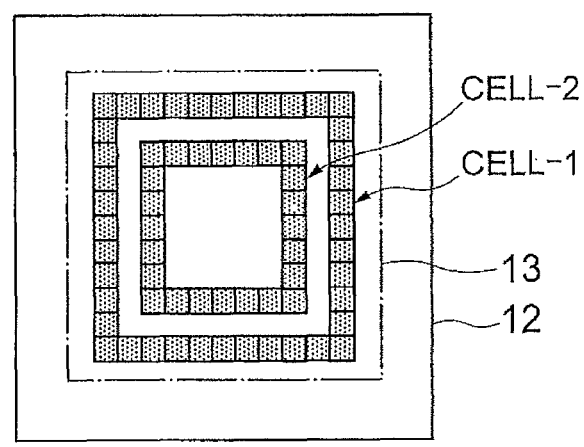

Modified first examples of arranging the first I/O cell (CELL-1) and the second I/O cell (CELL-2) in the second embodiment are shown in FIGS. 9A to 9C. In FIG. 9A, only for the first I/O cell (CELL-1), the outer I/O cell (CELL-1A) and the inner I/O cell (CELL-1B) are disposed. In FIG. 9B, only for the second I/O cell (CELL-2), the outer I/O cell (CELL-2A) and the inner I/O cell (CELL-2B) are disposed. As shown in FIG. 9C, each of the first I/O cell (CELL-1) and the second I/O cell (CELL-2) may be disposed in a single row.

Figure 10A:
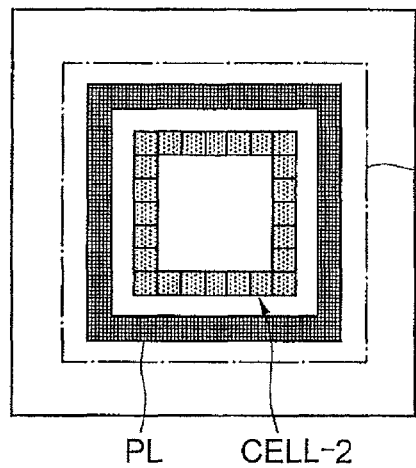
FIGS. 10A to 10D are schematic views showing second modified examples of the ball electrodes and the interconnect pads of the second embodiment.
Figure 10B:
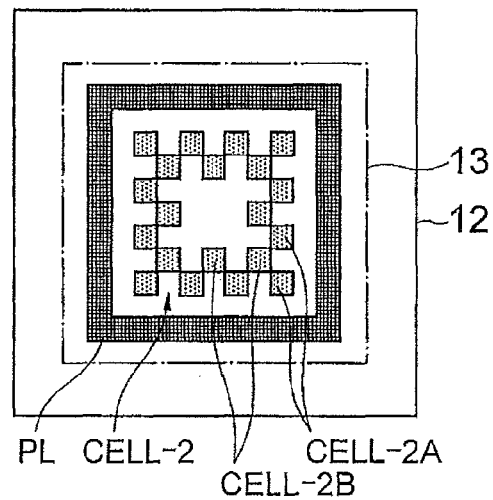
Figure 10C:
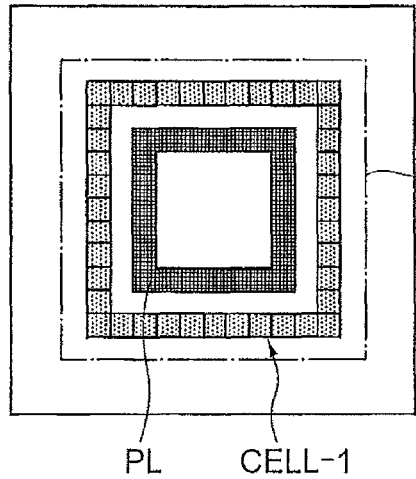
Figure 10D:
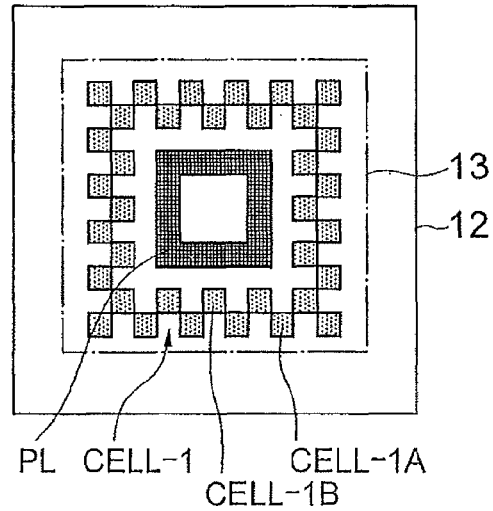
Figure 11A:
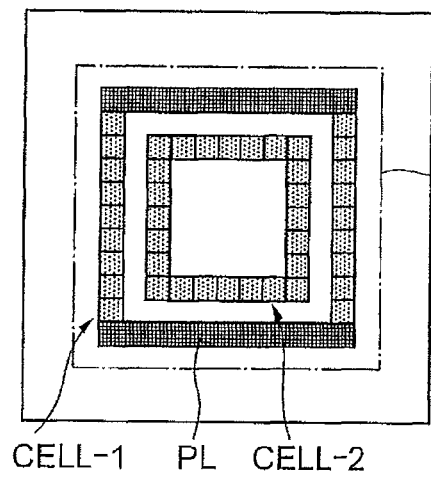
FIGS. 11A to 11D are schematic views showing third modified examples of the ball electrodes and the interconnect pads of the second embodiment.
Figure 11B:
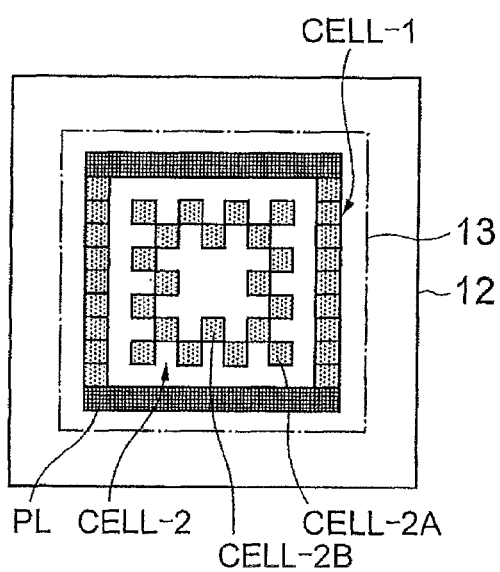
Figure 11C:
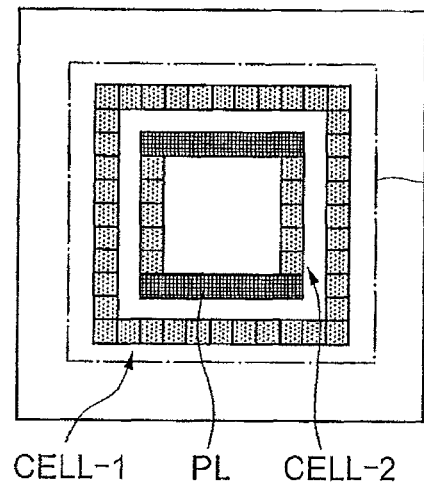
Figure 11D:
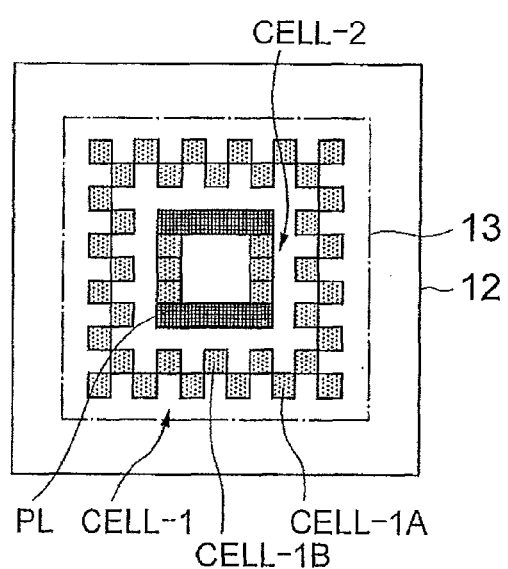
Figure 12A:
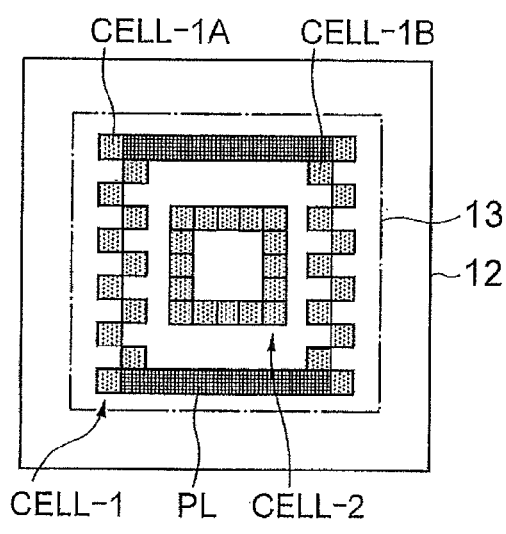
FIGS. 12A to 12D are schematic views showing fourth modified examples of the ball electrodes and the interconnect pads of the second embodiment.
Figure 12B:
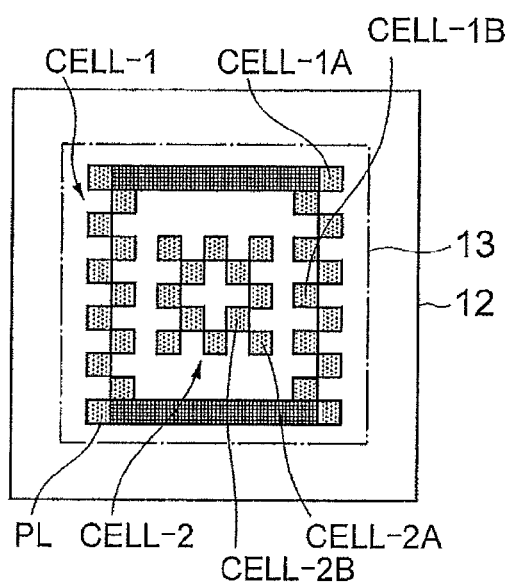
Figure 12C:
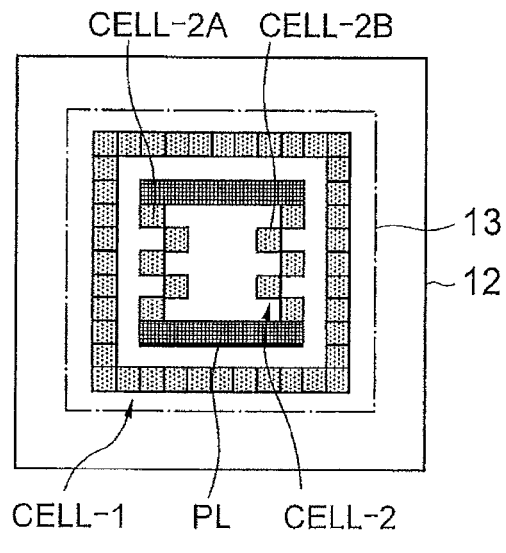
Figure 12D:
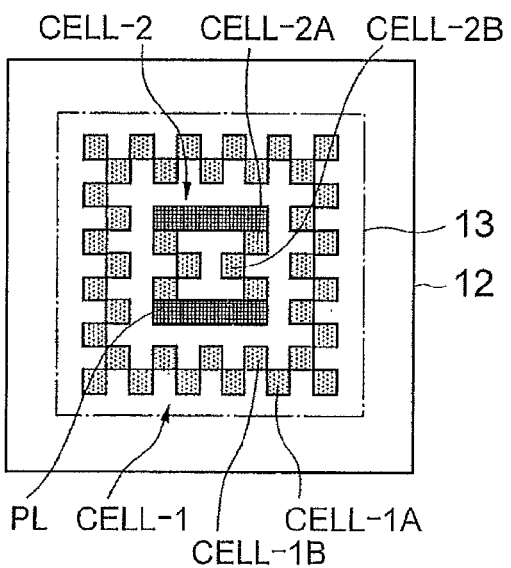

Modified second examples of arranging the I/O cells in the second embodiment are shown in FIGS. 10A to 10D in which either of the first I/O cell (CELL-1) and the second I/O cell (CELL-2) is not the I/O cell but the conventional peripherals. In FIG. 10A, the outer peripheral section is formed by peripherals PL and the inner section is formed by the second I/O cell (CELL-2). In FIG. 10B, the inner second I/O cell (CELL-2) of FIG. 10A is formed by the outer I/O cell (CELL-2A) and the inner I/O cell (CELL-2B). In FIG. 10C, the outer peripheral section is formed by the first I/O cell (CELL-1) and the inner section is formed by the peripherals PL. In FIG. 10D, the outer first I/O cell (CELL-1) of FIG. 10C is formed by the outer I/O cell (CELL-1A) and the inner I/O cell (CELL-1B).

Figure 1:
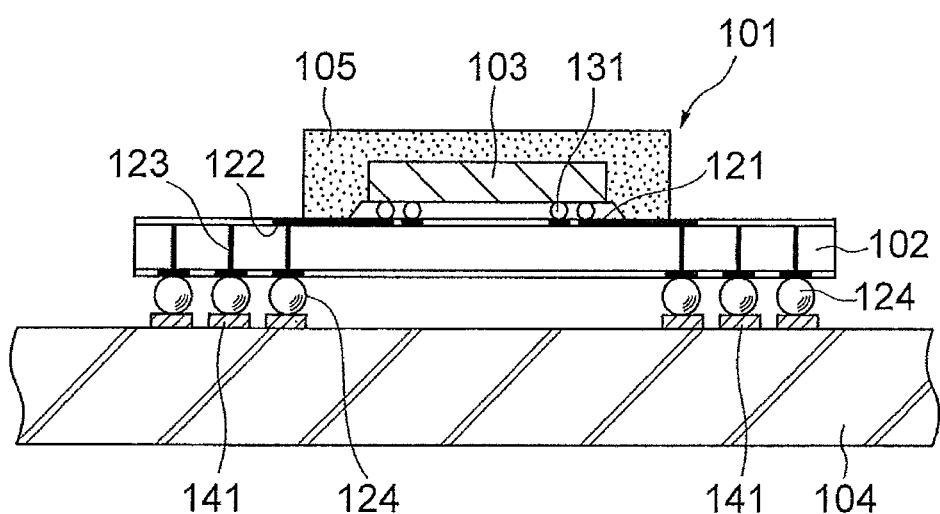
FIG. 1 is a sectional view showing a conventional semiconductor device.
Figure 2:
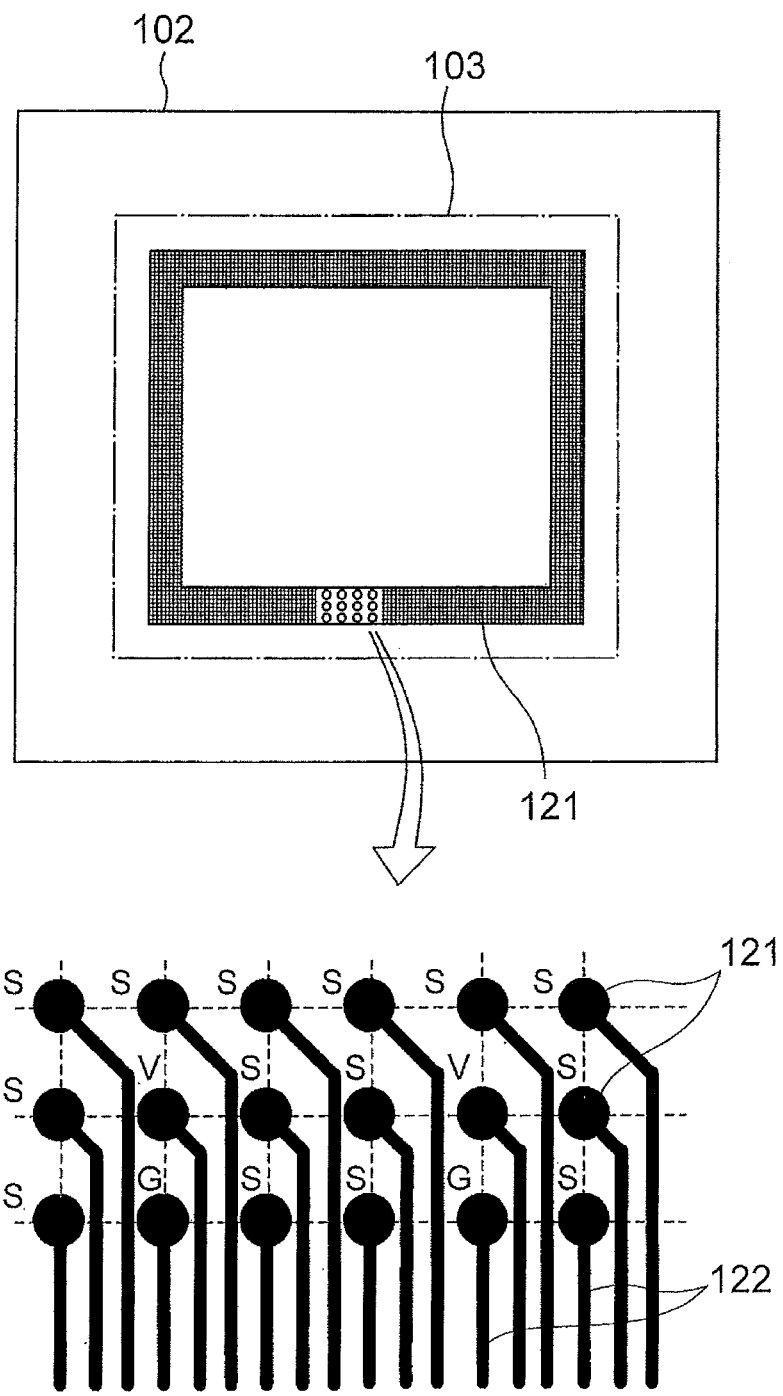
FIG. 2 is a schematic view showing interconnect pads and interconnect lines arranged on a packaging substrate of the conventional semiconductor device and an enlarged view showing a part of the arrangement.

As shown in FIGS. 11A to 11D corresponding to FIGS. 10A to 10D, respectively, part of the first I/O cell (CELL-1) or the second I/O cell (CELL-2) is formed by the peripherals PL to intermingle the I/O cells and the peripherals PL. Similarly, as shown in FIGS. 12A to 12D, part of the first I/O cells (CELL-1A, CELL-1B) or the second I/O cells (CELL-2A, CELL-2B) formed by the inner I/O cells and the outer I/O cells may be formed by the peripherals PL. In either case, the higher integration of the semiconductor device having the higher performances can be realized compared with the conventional configuration as shown in FIG. 2 because the ball electrodes and the number of the interconnect pads can be increased.

Figure 13:
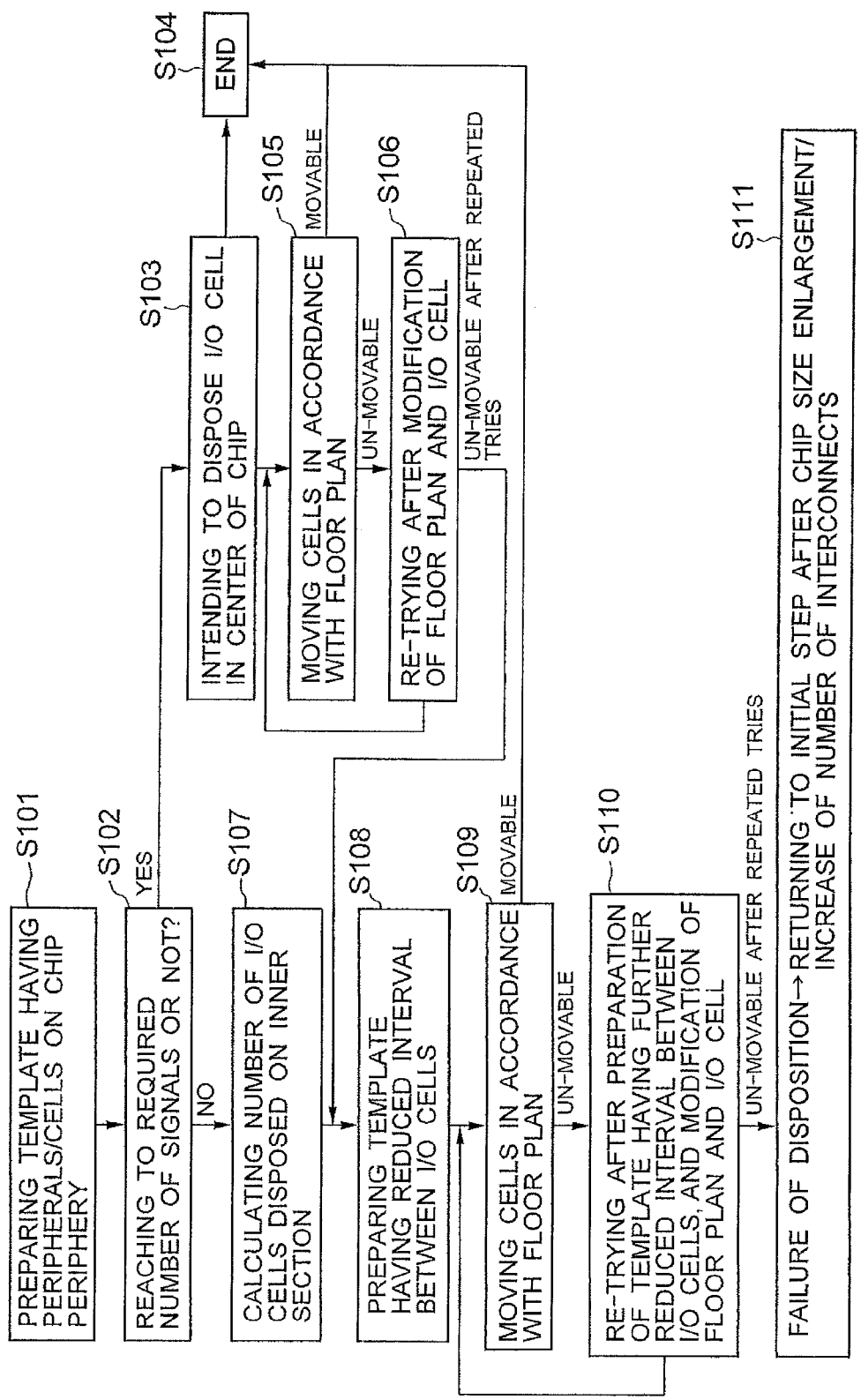
FIG. 13 is a flow chart sequentially showing steps for fabricating the semiconductor device of the present invention.

The method of disposing the ball electrodes 31 and the interconnect pads 21 as the I/O cells are substantially same for the semiconductor devices of the first and the second embodiments. The method for disposing the semiconductor device in the first embodiment will be described referring to a flow chart shown in FIG. 13.

At first, a template having I/O cells and peripherals to be disposed on a chip along the outer periphery of the chip is fabricated (S101). Then, the judgment is conducted whether or not the numbers of the balls electrodes and the interconnect pads of the I/O cell and the peripherals, and the number of required terminals reach to specified values (S102). When the numbers reach to the required values, the judgment is conducted whether or not the request for disposing I/O cells at the center of the chip (S103). In absence of the request, the disposal is finished (S104). In present of the request for disposing the I/O cells at the center of the chip, the cell is moved in accordance with a floor plan (S105). When the movement is possible, the disposal is finished (S104). When the movement is impossible, the step (S105) is again executed after the floor plan and the I/O cells are modified. When the movement is also impossible after the repetition of the processes, a following step (S108) is initiated.

On the other hand, when the number of the terminals does not reach to the required number in the step (S102), the number of the I/O cells disposed on the inner sections of the chip is calculated (S107) for increasing the number to the required one. Then, another new template having a reduced interval between the I/O cells is fabricated (S108). Then, the I/O cell is moved in accordance with a floor plan (S109). When the movement of all the I/O cells is possible, the disposal is finished (S104) because the I/O cells can be disposed on the outer periphery and on the inner section of the chip. When at least one of the I/O cells cannot move, the step (S109) is again executed after a further template having a reduced interval between the I/O cells is fabricated (S110). Or, depending on necessity, the step (S109) is again executed after the modification of the floor plan and the I/O cells. When the disposal of all the I/O cells is not finished after the plurality of the re-executions, the disposal is recognized to be failed, and the procedures are started from the first step (S101) after the chip is enlarged or the number of the interconnects is increased.

In the second embodiment, a process of diving the I/O cell into the first I/O cell and the second I/O cell is inserted between the steps (S107) and (S108), and the processes are conducted on and after the step (S108) for each of the I/O cells.

In the method described above, after the I/O cell is formed by grouping the S-terminal, the V-terminal and the G-terminal, the method of disposing the interconnect pads of the I/O cell and drawing the interconnect lines connected to the interconnect pads is determined in advance. Thereby, the propriety of drawing the interconnect lines at the time of preparing the floor plan can be easily judged to advantageously reduce a length of processing time (TAT). The method can be easily customized for every kind of the semiconductor devices by suitably using the I/O cells having different usages after the usages of each of the I/O cells are stored as information.

Although the array of 4×3 is exemplified as the arrangement of the I/O cells in the previous embodiments, the I/O cells can be arranged in an array having an arbitrary number. Depending on cases, the I/O cell may be formed by disposing the plurality of the conventional peripherals.

Although the examples are described for applying the configuration of the present invention to the ball electrodes 31 formed on the bottom surface of the chip 13 and the interconnect pads 21 and the interconnect lines 22 on the packaging substrate 12, 12A in the preceding embodiments, the present invention may be also applied to the ball electrodes 24 of the semiconductor device 11 and the interconnect pads 41 and the interconnect lines on the mounting substrate 14. The ball electrodes 24 on the bottom surface of the packaging substrate 12, 12A and the interconnect pads 41 on the top surface of the mounting substrate 14 are disposed as the I/O cells to increase the density of the ball electrodes 24 and the interconnect pads 41 to achieve the miniaturization of the chip and further to increase the number of the terminals, the higher integration of the semiconductor device having the higher performances can be realized. When the configuration of the second embodiment is applied, the mounting substrate 14 is multi-layered.

Since the above embodiment is described only for examples, the present invention is not limited to the above embodiment and various modifications or alterations can be easily made therefrom by those skilled in the art without departing from the scope of the present invention.

What is claimed is:

1. A semiconductor device comprising:
   a package substrate including an upper surface, a plurality of substrate pads formed on the upper surface, a plurality of wiring lines formed on the upper surface, and a lower surface opposite to the upper surface, the upper surface having a first substrate side and a second substrate side crossing to the first substrate side, the wiring lines being connected with the substrate pads, respectively;
   a semiconductor chip including a main surface, a plurality of chip pads formed on the main surface, and a back surface opposite to the main surface;
   a plurality of first electrodes arranged between the semiconductor chip and the package substrate; and
   a plurality of second electrodes formed over the lower surface;
   wherein the semiconductor chip is mounted over the package substrate via the first electrodes such that the main surface faces to the upper surface;
   wherein the chip pads are electrically connected with the substrate pads via the first electrodes, respectively;
   wherein the wiring lines are extended from the substrate pads toward the first substrate side, respectively;
   wherein the substrate pads are arranged along a first substrate side of the upper surface in a plan view, and arranged in rows;
   wherein the substrate pads has a first substrate pad group including a plurality of first substrate pads, and a second substrate pad group including a plurality of second substrate pads;
   wherein the first substrate pads are arranged in a matrix comprised of a plurality of first rows each parallel to a direction in which the first substrate side is extended and a plurality of first columns each parallel to a direction in which the second substrate side is extended, and arranged with a first pitch;
   wherein the second substrate pads are arranged in a matrix comprised of a plurality of second rows each parallel to the direction in which the first substrate side is extended and a plurality of second columns each parallel to the direction in which the second substrate side is extended, and arranged with the first pitch;
   wherein the second substrate pads are arranged further from the first substrate side of the upper surface than the first substrate pads in the plan view, and arranged further from the second substrate side of the upper surface than the first substrate pads in the plan view;
   wherein a distance between a first extended line of a first grid line connecting a plurality of first outer substrate pads of the first substrate pads with each other and a second extended line of a second grid line connecting a plurality of second outer substrate pads of the second substrate pads with each other is greater than zero and less than the first pitch;

wherein each of the first outer substrate pads is arranged in a column of the plurality of first columns closest to the second substrate pad group in the plan view; and wherein each of the second outer substrate pads is arranged in a column of the plurality of second columns closest to the first substrate pad group in the plan view.

2. The semiconductor device according to claim 1, wherein the package substrate has a third substrate side facing the second substrate side;

wherein the substrate pads further has a third substrate pad group including a plurality of third substrate pads;

wherein the third substrate pads are arranged in a matrix comprised of a plurality of third rows each parallel to the direction in which the first substrate side is extended and a plurality of third columns each parallel to the direction in which the second substrate side is extended, and arranged with the first pitch; and wherein the second substrate pads are arranged further from the first substrate side of the upper surface than the first and third substrate pads in the plan view, and arranged further from the second substrate side of the upper surface than the first substrate pads in the plan view, and arranged further from the third substrate side of the upper surface than the third substrate pads in the plan view.

3. The semiconductor device according to claim 2, wherein the wiring lines has a plurality of first wiring lines connected with the first substrate pads, respectively, a plurality of second wiring lines connected with the second substrate pads, respectively, and a plurality of third wiring lines connected with the third substrate pads, respectively; and wherein the second wiring lines are extended from the second substrate pads toward the first substrate side via an area of the upper surface between the first substrate pad group and the third substrate pad group in the plan view.

4. The semiconductor device according to claim 1, wherein the substrate pads includes a signal pad, a voltage source pad and a ground pad.

5. The semiconductor device according to claim 1, wherein an external size of the package substrate is larger than that of the semiconductor chip.

* * * * *